(12) United States Patent
Wu et al.

(10) Patent No.: US 7,932,565 B2
(45) Date of Patent: Apr. 26, 2011

(54) INTEGRATED CIRCUIT STRUCTURE HAVING BOTTLE-SHAPED ISOLATION

(75) Inventors: Hsiao Che Wu, Taoyuan County (TW); Wen Li Tsai, Kaohsiung County (TW)

(73) Assignee: Promos Technologies Inc., Hsinchu (TW)

( * ) Notice: Subject to any disclaimer, the term of this patent is extended or adjusted under 35 U.S.C. 154(b) by 402 days.

(21) Appl. No.: 12/193,502

(22) Filed: Aug. 18, 2008

(65) Prior Publication Data
US 2010/0038745 A1 Feb. 18, 2010

(51) Int. Cl.
*H01L 21/70* (2006.01)
(52) U.S. Cl. .. 257/374; 257/501; 257/506; 257/E29.018
(58) Field of Classification Search .................... 257/93, 257/374, 446, 501, 504, 506, 524, 725, E29.018
See application file for complete search history.

(56) References Cited

U.S. PATENT DOCUMENTS

| 6,566,177 | B1 | 5/2003 | Radens et al. |
| 2006/0043472 | A1* | 3/2006 | Wang et al. ................... 257/330 |
| 2007/0238233 | A1* | 10/2007 | Sadaka et al. ................. 438/187 |

FOREIGN PATENT DOCUMENTS
TW 543109 7/2003
* cited by examiner

*Primary Examiner* — Evan Pert
*Assistant Examiner* — Scott Wilson
(74) *Attorney, Agent, or Firm* — WPAT, P.C.; Anthony King

(57) ABSTRACT

An integrated circuit structure comprises a semiconductor substrate, a device region positioned in the semiconductor substrate, an insulating region adjacent to the device region, an isolation structure positioned in the insulating region and including a bottle portion and a neck portion filled with a dielectric material, and a dielectric layer sandwiched between the device region and the insulation region.

18 Claims, 10 Drawing Sheets

INTEGRATED CIRCUIT STRUCTURE HAVING BOTTLE-SHAPED ISOLATION

BACKGROUND OF THE INVENTION (A) Field of the Invention

The present invention relates to an integrated circuit structure and method for preparing the same, and more particularly, to an integrated circuit structure having a bottle-shaped shallow trench isolation and method for preparing the same.

(B) Description of the Related Art

Conventional integrated circuit fabrication processes use a local oxidation of silicon (LOCOS) technique or shallow trench isolation (STI) technique to electrically isolate wafer-mounted electronic devices from each other, so as to avoid short circuits and cross interference. Due to the LOCOS technique's forming a field oxide layer covering a larger wafer area and also because it forms a "bird's beak" pattern, advanced integrated circuit fabrication generally selects the STI technique to electrically isolate electronic devices.

FIG. 1 to FIG. 4 illustrate a method for preparing an integrated circuit structure 10 having a planar metal-oxide-semiconductor field effect transistor (MOSFET) 36 according to the prior art. First, a mask 15 having several openings 18 is formed on a semiconductor substrate 12, with the mask 15 including a pad oxide layer 14 and a pad nitride layer 16. Subsequently, an anisotropic etching process is performed to form a plurality of trenches 20 in the semiconductor substrate 12 under the openings 18, with the trenches 20 surrounding an active area 22, as shown in FIG. 2.

Referring to FIG. 3, a high-density chemical vapor deposition process (HDP-CVD) is performed to form a silicon oxide layer filling the trenches 20, and a planarization process such as the chemical mechanical polishing process is performed to remove a portion of the silicon oxide layer from the mask 15 to form a dielectric block 26 in the trenches 20 so as to complete the shallow trench isolation structure isolating the active area 22. Subsequently, a gate oxide 28, a gate 30, two diffusion regions 32 serving as the source and the drain, and a nitride spacer 34 on the sidewall of the gate 30 are formed in the active area 22 to complete the integrated circuit structure 10 having the planar transistor 36, as shown in FIG. 4.

Although the dielectric block 26 in the trenches 20 serving as the shallow trench isolation structure isolates the left and right sides of the planar transistor 36 in the active area 22, the integrated circuit structure 10 still suffers from various types of current leakage through the wide portion of the semiconductor substrate 12 directly below the gate 30 and the two diffusion regions 32 of the planar transistor 36.

Silicon-on-insulator (SOI) structure is widely used to solve this current leakage problem, and has the advantages of lower parasitic capacitance, improved power consumption, and higher resistance to latch-up due to complete isolation of the n- and p-structures when it is used for integrated circuit application. The conventional methods of preparing the SOI structure include SIMOX, SIMNI, SmartCut™ and Nanocleave™; most of these are expensive or low in throughput. In addition, there is a major disadvantage to the SOI structure known as the "floating body effect" originating from the accumulation of electric charge and lack of thermal conductivity, which needs to be resolved by designing an extra current path.

SUMMARY OF THE INVENTION

One aspect of the present invention provides an integrated circuit structure having a bottle-shaped shallow trench isolation and method for preparing the same, which can reduce the substrate leakage problem in the conventional planar transistor and prevent the floating body effect occurring in the conventional silicon-on-insulator substrate.

An integrated circuit structure according to this aspect of the present invention comprises a semiconductor substrate, a device region positioned in the semiconductor substrate, an insulating region adjacent to the device region, an isolation structure positioned in the insulating region and including a bottle portion and a neck portion filled with a dielectric material, and a dielectric layer sandwiched between the device region and the insulation region.

Another aspect of the present invention provides an integrated circuit structure comprising a semiconductor substrate, a device region positioned in the semiconductor substrate, a mushroom-shaped pillar positioned in the device region and including a stem portion and a head portion on the stem portion, an insulating region adjacent to the device region, an isolation structure positioned in the insulating region and including a bottle portion and a neck portion on the bottle portion, a dielectric layer sandwiched between the device region and the insulation region, and an insulating layer sandwiched between the isolation structure and the mushroom-shaped pillar.

Another aspect of the present invention provides an integrated circuit structure comprising a semiconductor substrate, a device region positioned in the semiconductor substrate, a mushroom-shaped pillar positioned in the device region and including a stem portion and a head portion on the stem portion, an insulating region adjacent to the device region, an isolation structure positioned in the insulating region and including a bottle portion and a neck portion on the bottle portion, a dielectric layer sandwiched between the device region and the insulation region, and wherein the stem portion of the mushroom-shaped pillar is made of an insulating material, and the head portion of the mushroom-shaped pillar is surrounded by the dielectric layer.

The conventional integrated circuit structure still suffers from various types of current leakage through the wide portion of the semiconductor substrate directly below the gate and the source/drain regions of the planar transistor. In contrast, according to the integrated circuit structure of the present invention, the portion of the semiconductor substrate directly below the device region with the transistor therein is much narrower, which can effectively solve the current leakage problem of the conventional integrated circuit structure.

The silicon-on-insulator (SOI) structure is widely used to solve the current leakage problem of the conventional planar transistor; however, there is a major disadvantage of the SOI structure known as the "floating body effect" originating from the accumulation of charges and lack of thermal conductivity, which needs to be resolved by designing an extra current path. In contrast, the integrated circuit structure of the present invention inherently possesses a current path, which can effectively solve the floating body effect of the conventional SOI structure, without designing an extra current path.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
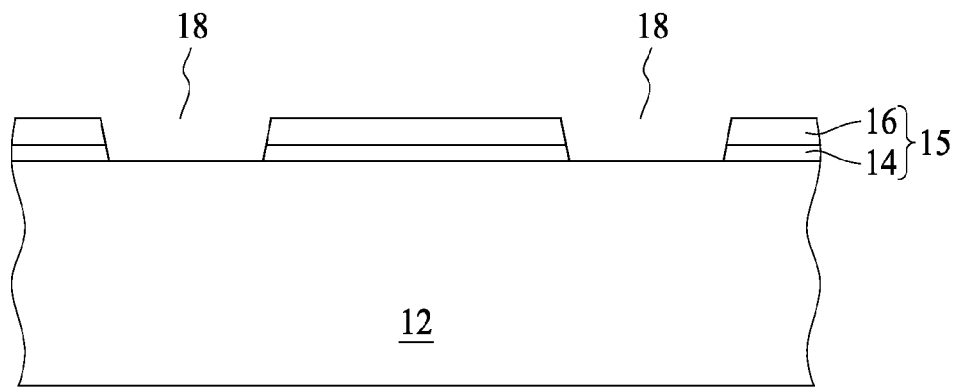
FIG. 1 to FIG. 4 illustrate a method for preparing an integrated circuit structure according to the prior art.
Figure 2:
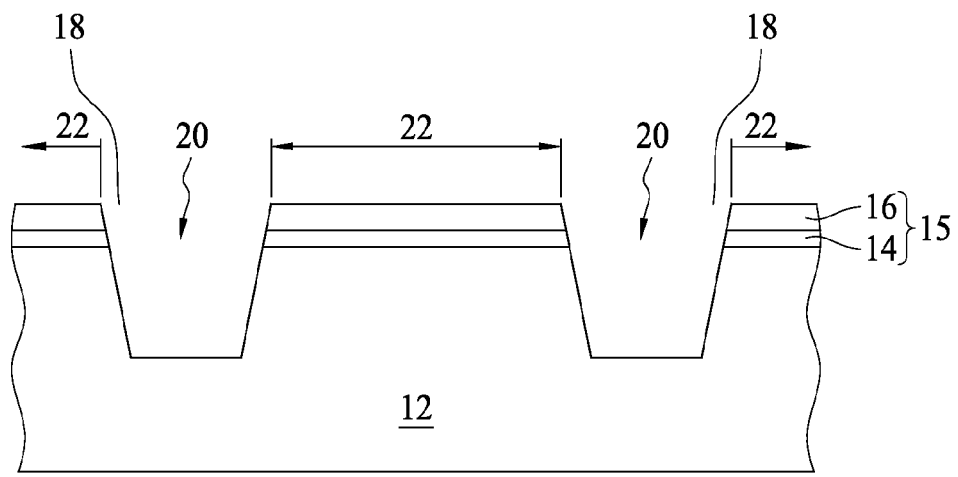
Figure 3:
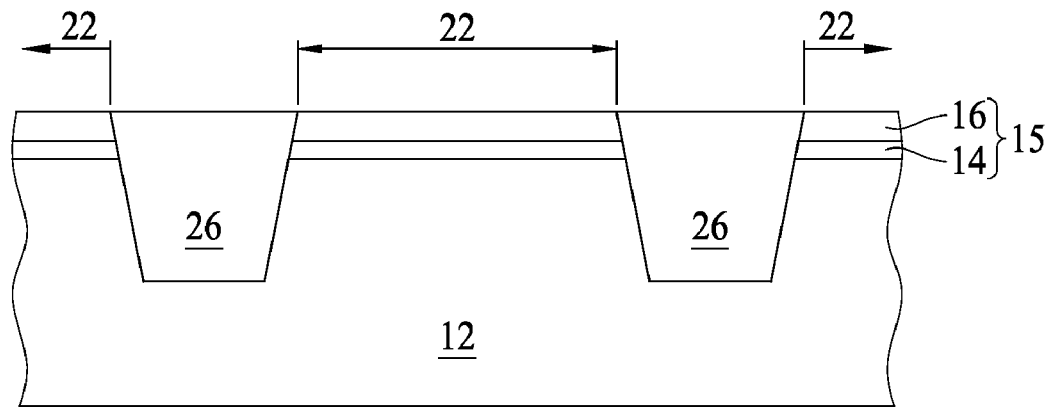

FIG. 5 to FIG. 12 illustrate a method for preparing an integrated circuit structure 40 according to one embodiment of the present invention. First, a plurality of top masks 48 are formed on a semiconductor substrate 42 such as the silicon substrate by the deposition process followed by the lithographic process and the etching process, and a dry etching process is then performed to remove a portion of the semiconductor substrate 42 not covered by the top masks 48 to form a plurality of protrusions 50. Each of the top masks 48 includes an oxide layer 44 and a nitride layer 46.

Figure 6:
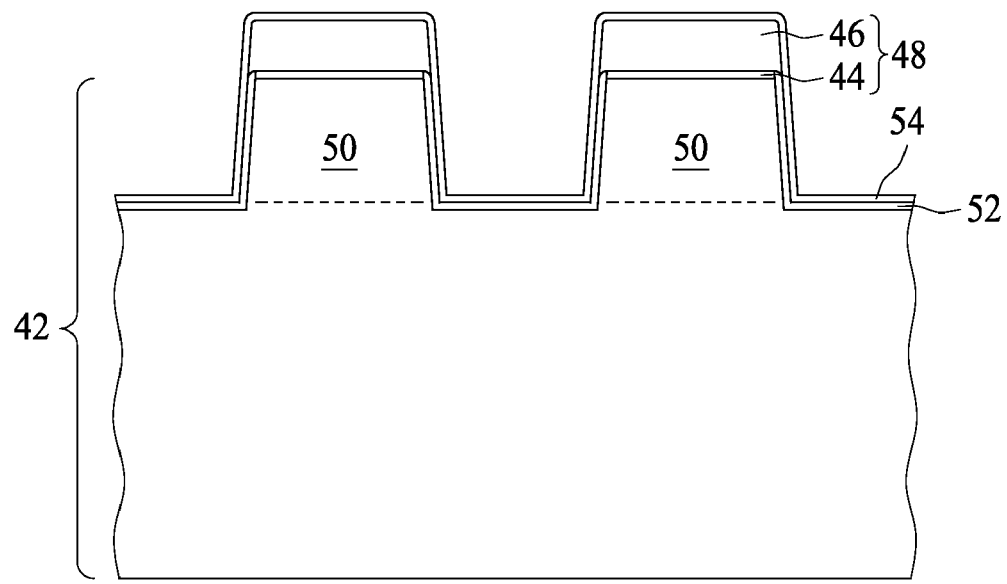
Figure 7:
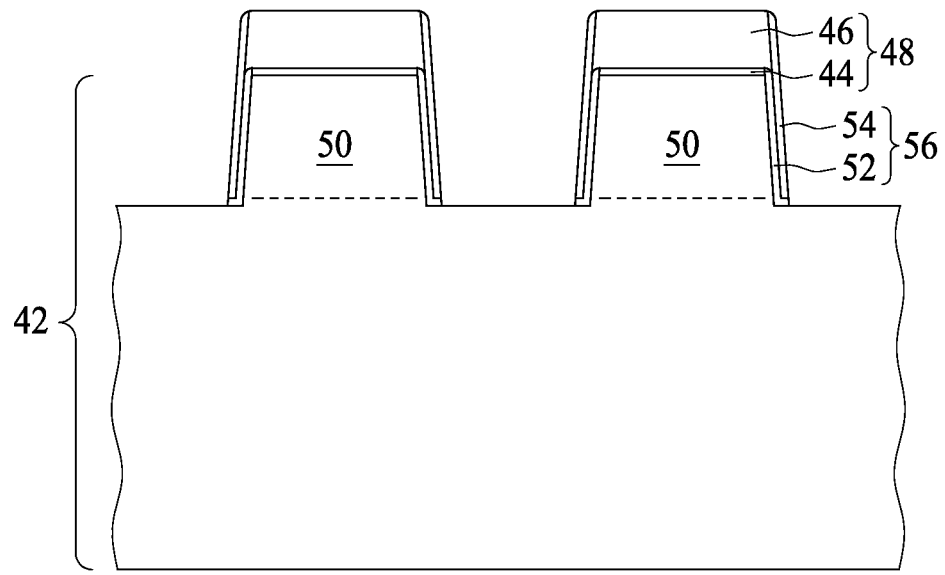

Referring to FIG. 6, a thermal treating process is performed to form a wall oxide layer (dielectric layer) 52 covering the sidewalls of the protrusions 50 and the surface of the semiconductor substrate 42, and a deposition process is then performed to form a liner nitride layer (dielectric layer) 54 on the wall oxide layer 52. Subsequently, an etching process such as an etching back process is performed to remove a portion of the wall oxide layer 52 and the liner nitride layer 54 from the surface of the semiconductor substrate 42 to form a plurality of side masks 56 covering sidewalls of the protrusions 50, as shown in FIG. 7.

Figure 8:
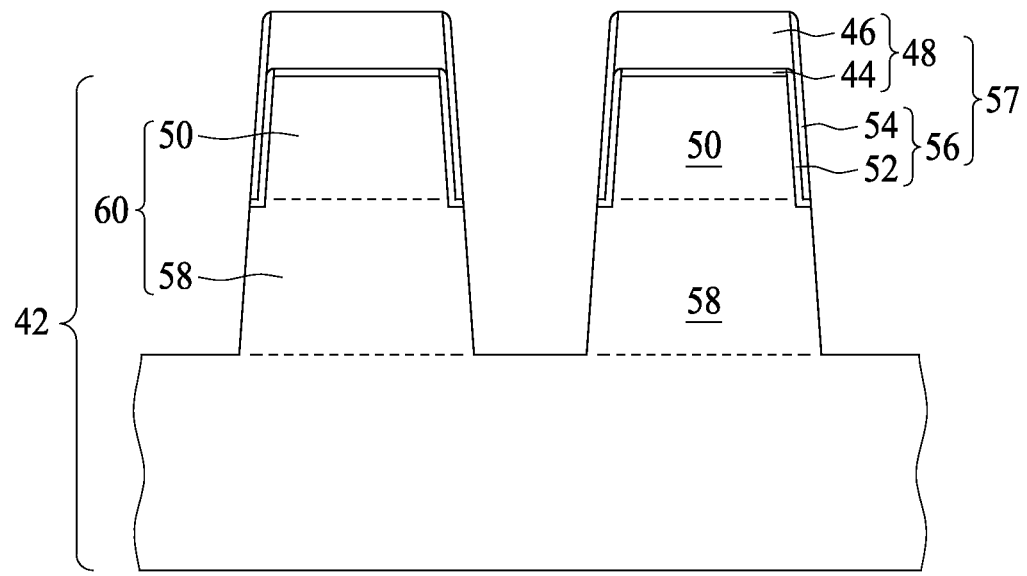
Figure 9:
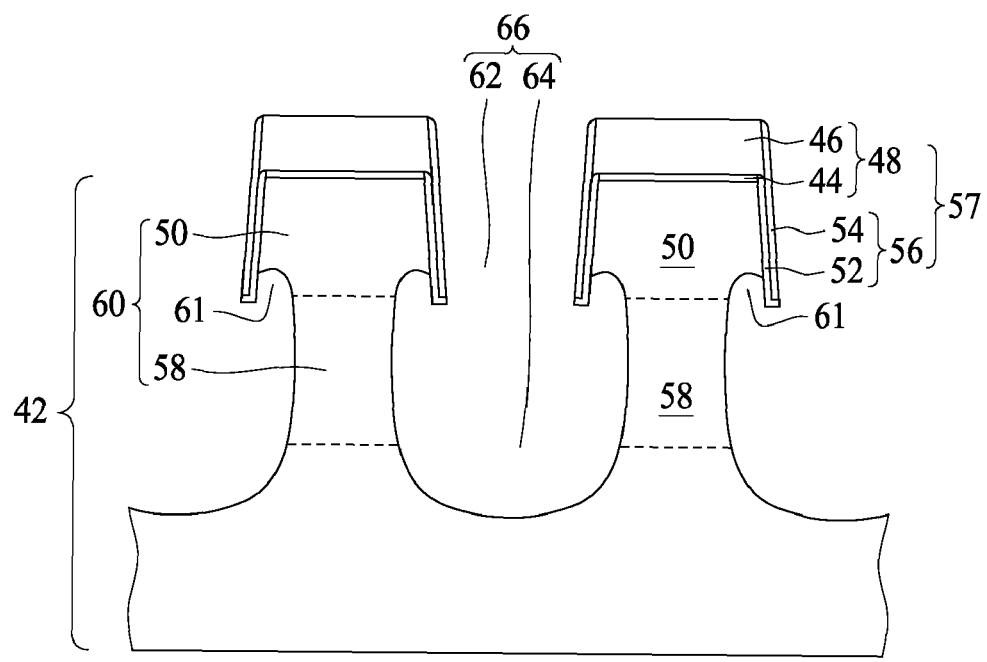

Referring to FIG. 8, the top masks 48 and the side masks 56 are used in combination as a hard mask 57 to perform a dry etching process to remove a portion of the semiconductor substrate 42 not covered by the top masks 48 and the side masks 56 to form a plurality of pillars 60 in a semiconductor substrate 42. Each of the pillars 60 includes an upper portion (protrusion) 50 covered by the hard mask 57 and a bottom portion 58 below the upper portion 50. Subsequently, an isotropic etching process such as the dry etching or wet process is performed to remove a portion of the semiconductor substrate 42 not covered by the hard mask 57 to form a trench 66 in the semiconductor substrate 42, as shown in FIG. 9. In particular, the etching process forms the trench 66 including a bottle portion 64 in the semiconductor substrate 42 and a neck portion 62 on the bottle portion 64, and the shape of the pillar 60 is changed into a mushroom shape. Furthermore, the etching process also forms undercuts 61 in the pillars 60.

Figure 10:
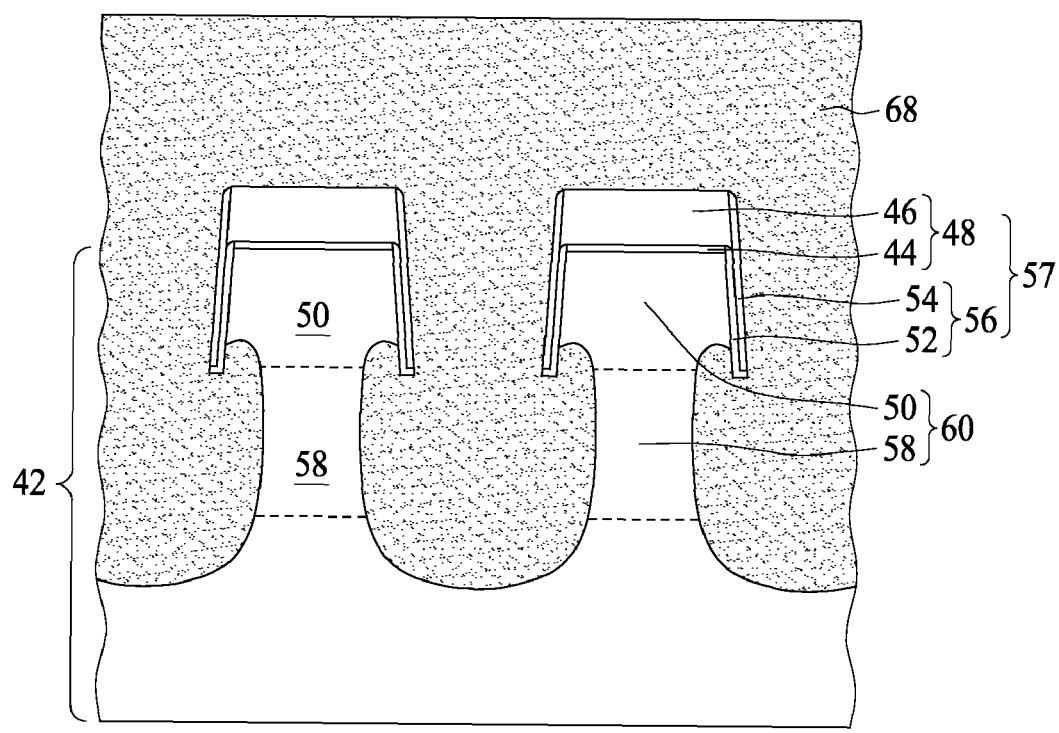
Figure 11:
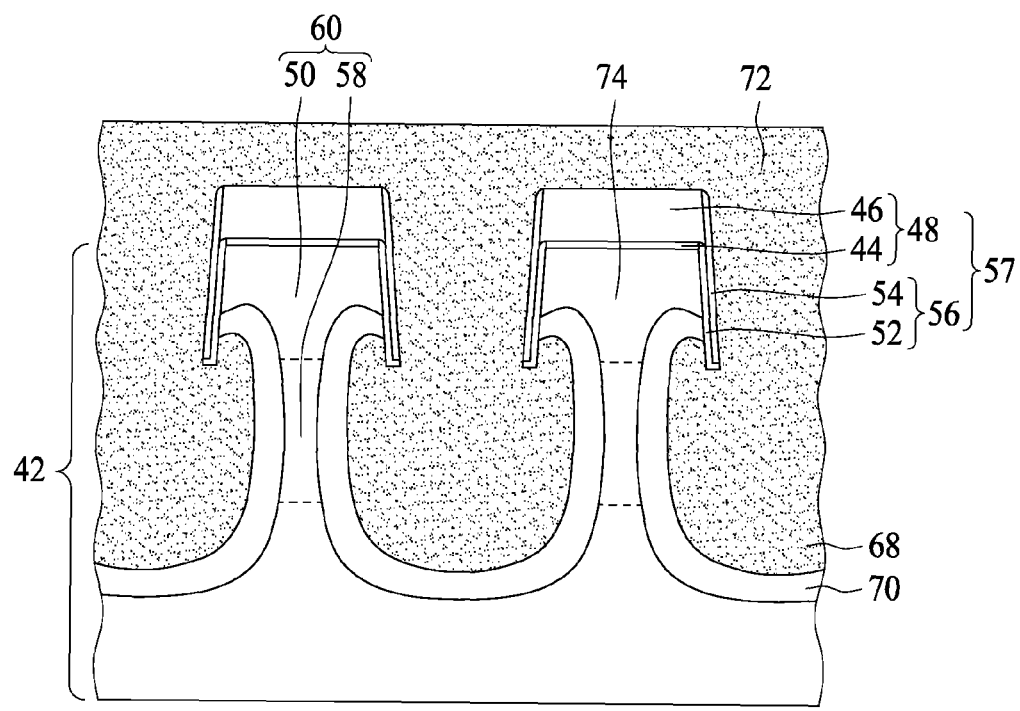

Referring to FIG. 10, a spin-coating process is performed to form a dielectric layer 68 such as a spin-on dielectric (SOD) filling the trench 66 and covering the upper surface of the semiconductor substrate 42. In particular, the spin-coating process fills the trench 66 with the liquid dielectric material, which has a better trench-filling ability and can be used to fill trenches with high aspect ratio. Subsequently, a thermal treating process is performed in an oxygen-containing atmosphere or steam-containing atmosphere to convert a portion of the semiconductor substrate 42 contacting the dielectric layer 68 into an insulation layer 70 by the thermal oxidation process, as shown in FIG. 11.

In particular, the thermal treating process not only removes solvent from the dielectric layer 68 to solidify the dielectric layer 68, but also reduces the width of the bottom portion 58 of the pillar 60 such that the shape of the pillar 60 is changed into a mushroom shape, with the bottom portion 58 serving as the stem and the upper portion 50 serving as the head of the mushroom. Therefore, adjusting the processing time of the thermal treating process can change the width of the bottom portion (the stem) 58 of the mushroom-shaped pillar 60. In particular, the structure shown in FIG. 11 can be considered as a device region 74 and an insulating region 72 adjacent to the device region 74, and the insulating region 72 can be considered as a bottle-shaped shallow trench isolation structure surrounding a device region 74 in the mushroom-shaped pillar 60 of the semiconductor substrate 42. Furthermore, the dielectric layers 52 and 54 are sandwiched between the device region 72 and the insulation region 74. The insulation layer 70 is sandwiched between the bottle-shaped shallow trench isolation structure and the mushroom-shaped pillar 60.

The device region 74 is positioned in the upper portion 60 of the mushroom-shaped pillar 60. The width of the head portion (upper portion 50) is larger than that of the stem portion (bottom portion 58), and the width of the stem portion changes gradually. The device region 74 is surrounded by the bottle-shaped insulating region 72, and there is only a very narrow current path (the bottom portion 58 of the mushroom-shaped pillar 60) to the bottom of the semiconductor substrate 42. Consequently, the device region 74 can be considered as a semi-insulated active area surrounded by the bottle-shaped insulating region 72. Furthermore, the silicon oxide in the insulation layer 70 is formed by the thermal oxidation process, and thus has a higher resistance to an acidic etchant than does the dielectric material of the dielectric layer 68.

Figure 12:
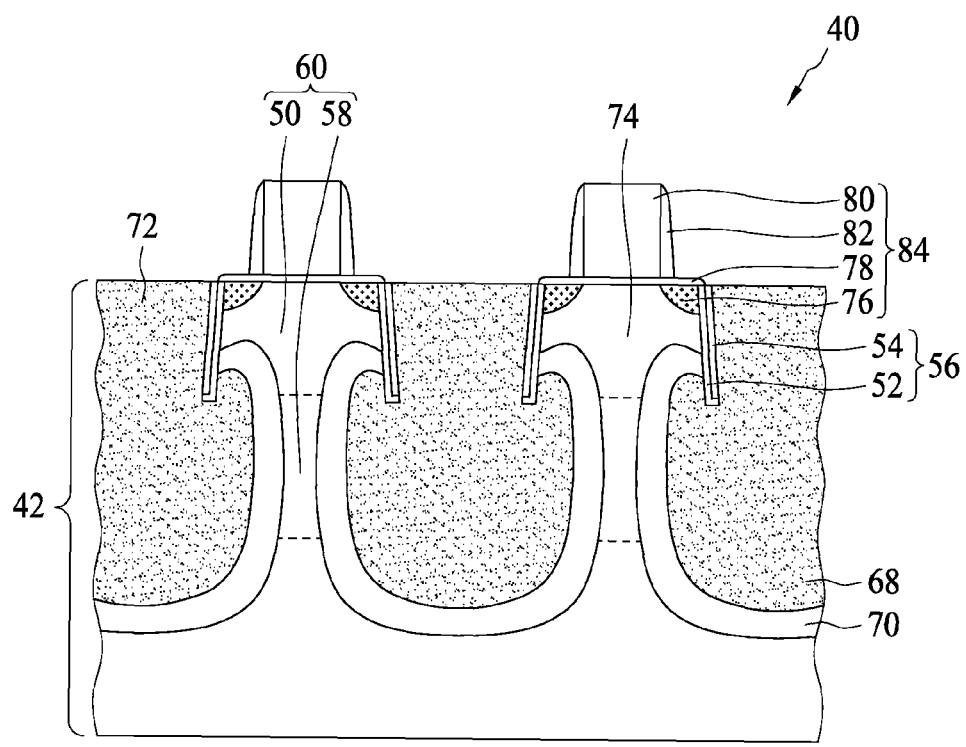
Figure 13:
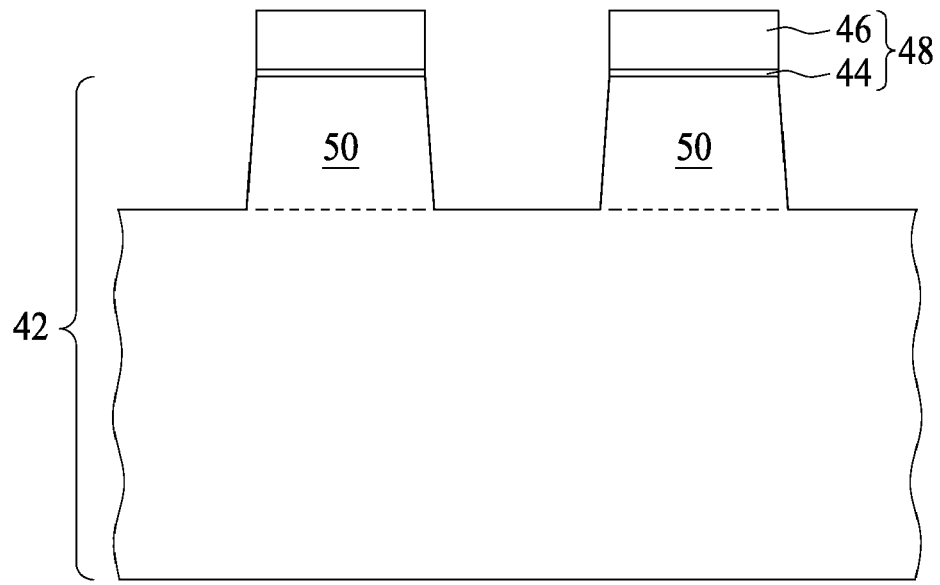
FIG. 13 to FIG. 20 illustrate a method for preparing an integrated circuit structure according to another embodiment of the present invention.

Referring to FIG. 12, the top masks 48 and a portion of the dielectric layer 68 above the semiconductor substrate 42 are removed by a planarization process such as the chemical mechanical polishing process. Subsequently, a transistor structure 84 is formed in the device region 74 and an insulation layer 82 is formed to cover the transistor structure 84 and the semiconductor substrate 42 so as to complete the integrated circuit structure 40. The transistor structure 84 may include two diffusion regions 76 in the upper portion (protrusion) 50 of the semiconductor substrate 42, a gate oxide layer 78 on the semiconductor substrate 42, a gate stack 80 on the gate oxide layer 78 and two nitride spacers 82 on the sidewalls of the gate stack 80.

The conventional integrated circuit structure 10 shown in FIG. 4 still suffers from various types of current leakage through the wide portion of the semiconductor substrate 12 directly below the gate 30 and the two diffusion regions 32 of the planar transistor 36. In contrast, according the integrated circuit structure 40 of the present invention, the portion (the bottom portion of the mushroom-shaped pillar 60) of the semiconductor substrate 42 directly below the transistor structure 84 in FIG. 12 is much narrower, which can effectively solve the current leakage problem of the conventional integrated circuit structure 10.

Figure 4:
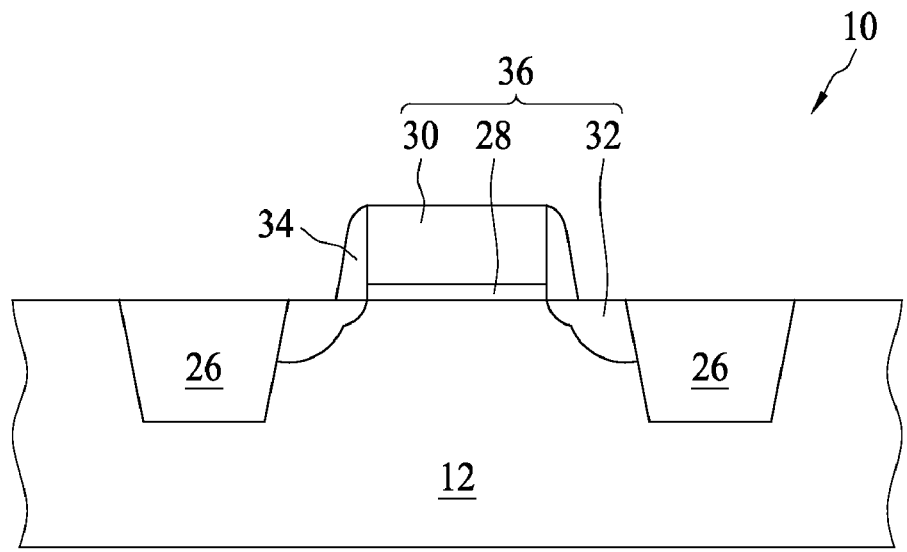
Figure 5:
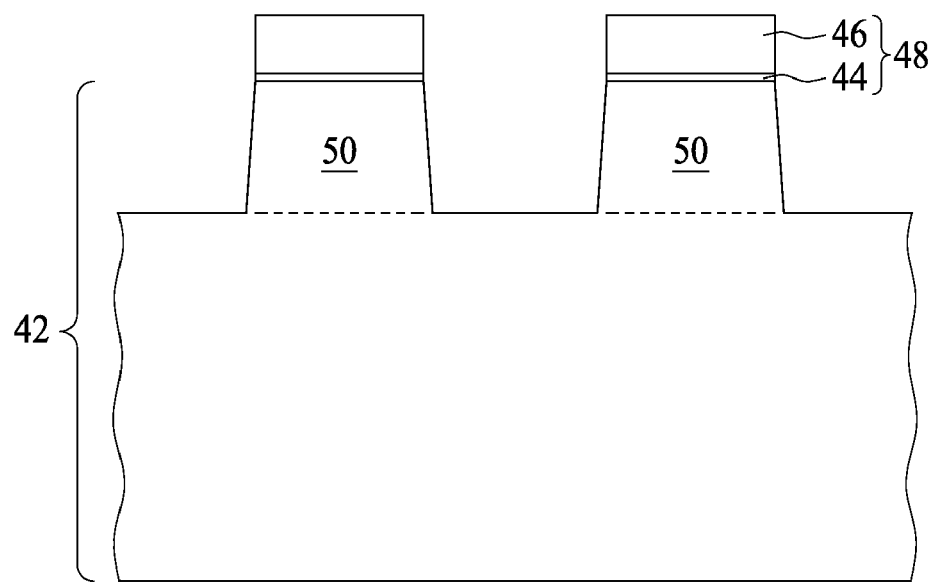
FIG. 5 to FIG. 12 illustrate a method for preparing an integrated circuit structure according to one embodiment of the present invention.

The silicon-on-insulator (SOI) structure is widely used to solve the current leakage problem of the conventional planar transistor 36 shown in FIG. 4; however, there is a major disadvantage of the SOI structure known as the "floating body effect" originating from the accumulation of electrical charges and lack of thermal conductivity, which need to be resolved by designing an extra current path. In contrast, the integrated circuit structure 40 in FIG. 12 inherently possesses a current path formed by the bottom portion 58 of the pillar 60, which can effectively solve the floating body effect of the SOI structure without designing an extra current path.

FIG. 13 to FIG. 20 illustrate a method for preparing an integrated circuit structure 40' according to another embodiment of the present invention. First, a plurality of top masks 48 are formed on a semiconductor substrate 42 such as the silicon substrate by the deposition process followed by the lithographic process and the etching process, and a dry etching process is then performed to remove a portion of the semiconductor substrate 42 not covered by the top masks 48 to form a plurality of protrusions 50. Each of the top masks 48 includes an oxide layer 44 and a nitride layer 46.

Figure 14:
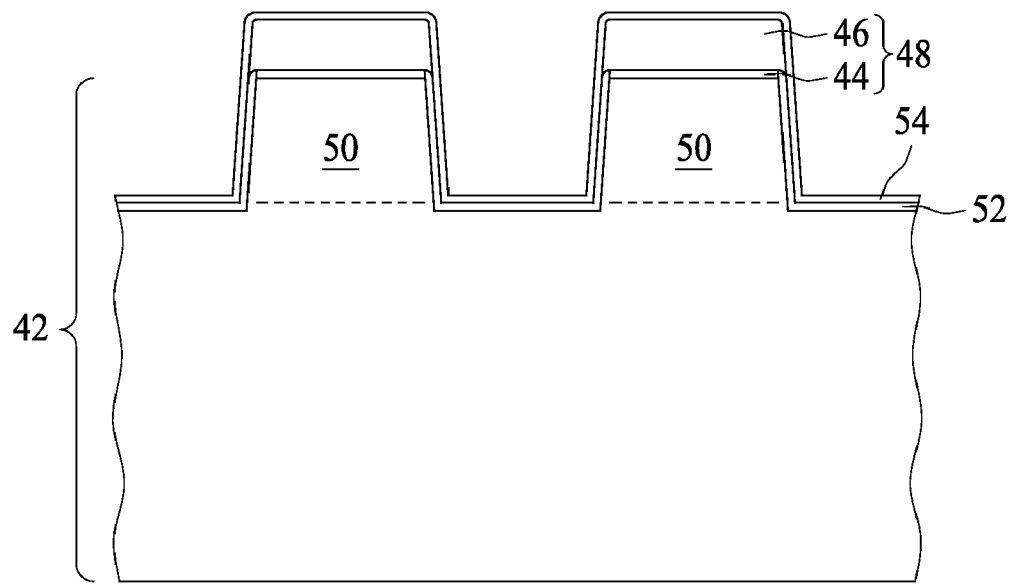
Figure 15:
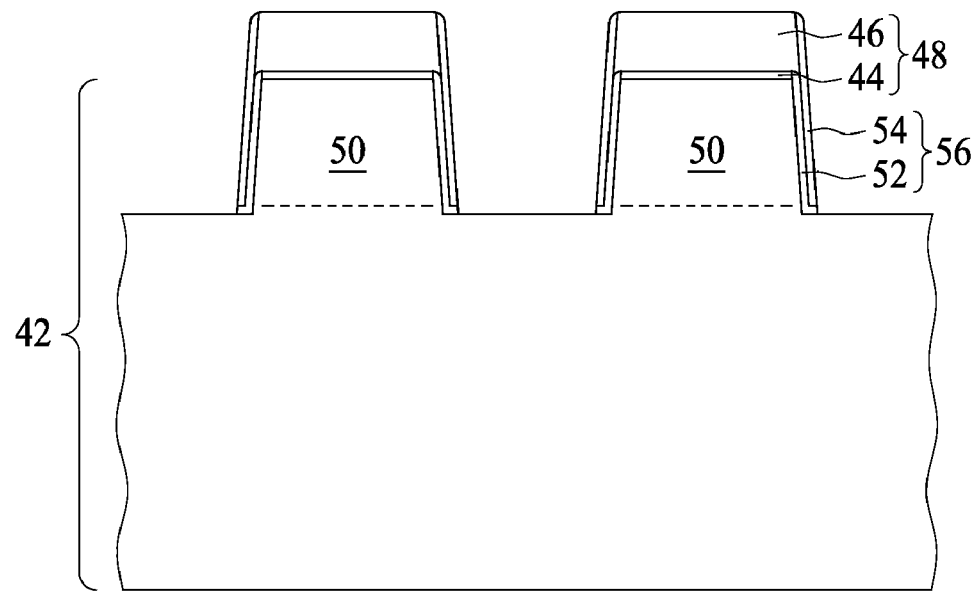

Referring to FIG. 14, a thermal treating process is performed to form a wall oxide layer (dielectric layer) 52 covering the sidewalls of the protrusions 50 and the surface of the semiconductor substrate 42, and a deposition process is then performed to form a liner nitride layer (dielectric layer) 54 on the wall oxide layer 52. Subsequently, an etching process such as an etching back process is performed to remove a portion of the wall oxide layer 52 and the liner nitride layer 54 from the surface of the semiconductor substrate 42 to form a plurality of side masks 56 covering sidewalls of the protrusions 50, as shown in FIG. 15.

Figure 16:
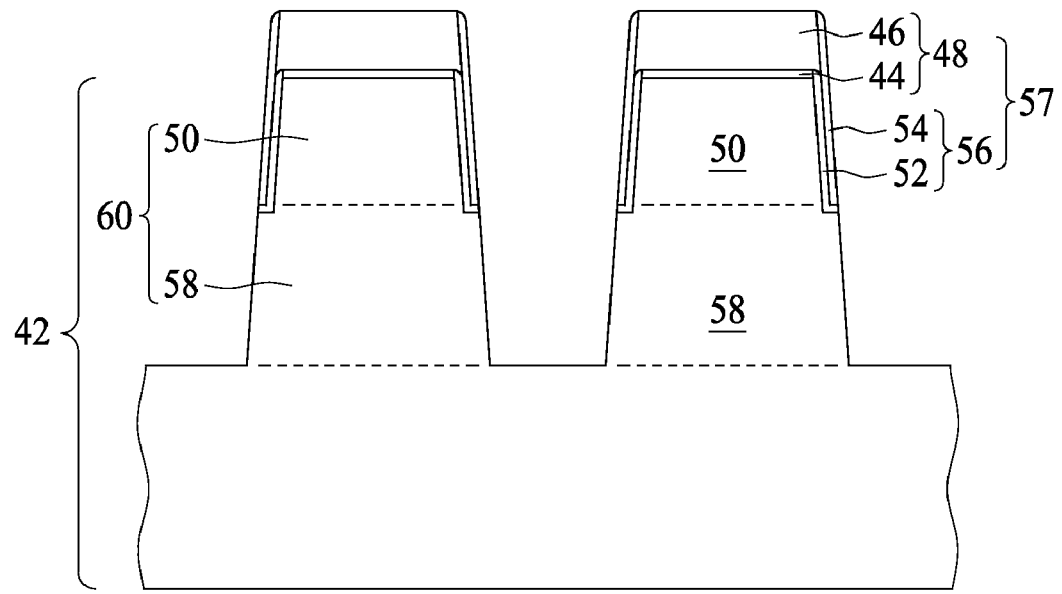
Figure 17:
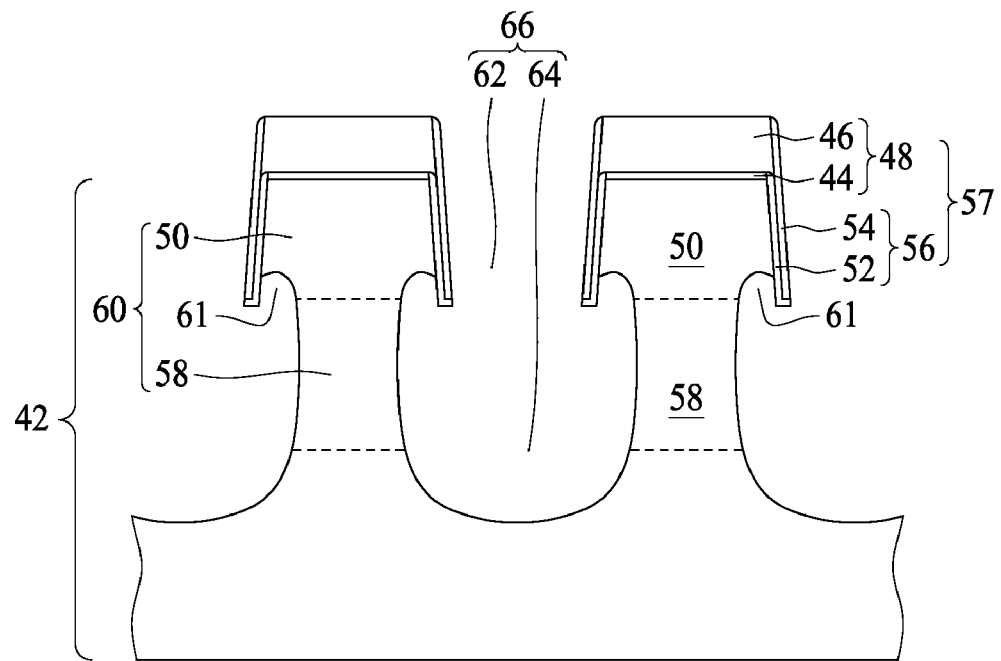

Referring to FIG. 16, the top masks 48 and the side masks 56 are used as a hard mask 57 to perform a dry etching process to remove a portion of the semiconductor substrate 42 not covered by the top masks 48 and the side masks 56 to form a plurality of pillars 60 in a semiconductor substrate 42. Each of the pillars 60 includes a head portion (protrusion) 50 covered by the hard mask 57 and a stem portion 58 below the head portion 50. Subsequently, an etching process such as the dry etching process is performed to remove a portion of the semiconductor substrate 42 not covered by the hard mask 57 to form a trench 66 in the semiconductor substrate 42, as shown in FIG. 17. In particular, the isotropic etching process forms the trench 66 including a bottle portion 64 in the semiconductor substrate 42 and a neck portion 62 on the bottle portion 64, and the shape of the pillar 60 is changed into a mushroom shape. Furthermore, the etching process also forms undercuts 61 in the pillars 60.

Figure 18:
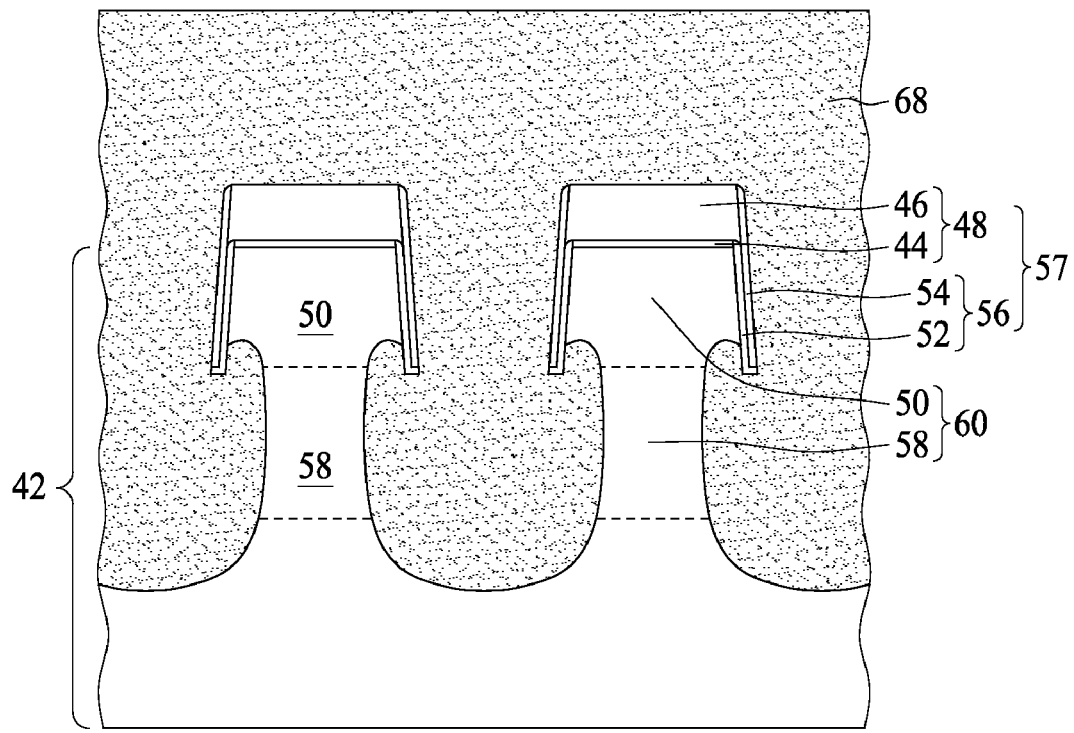

Referring to FIG. 18, a spin-coating process is performed to form a dielectric layer 68 such as a spin-on dielectric (SOD) filling the trench 66 and covering the upper surface of the semiconductor substrate 42. In particular, the spin-coating process fills the trench 66 with the liquid dielectric material, which has a better trench-filling ability and can be used to fill trenches with high aspect ratio.

Figure 19:
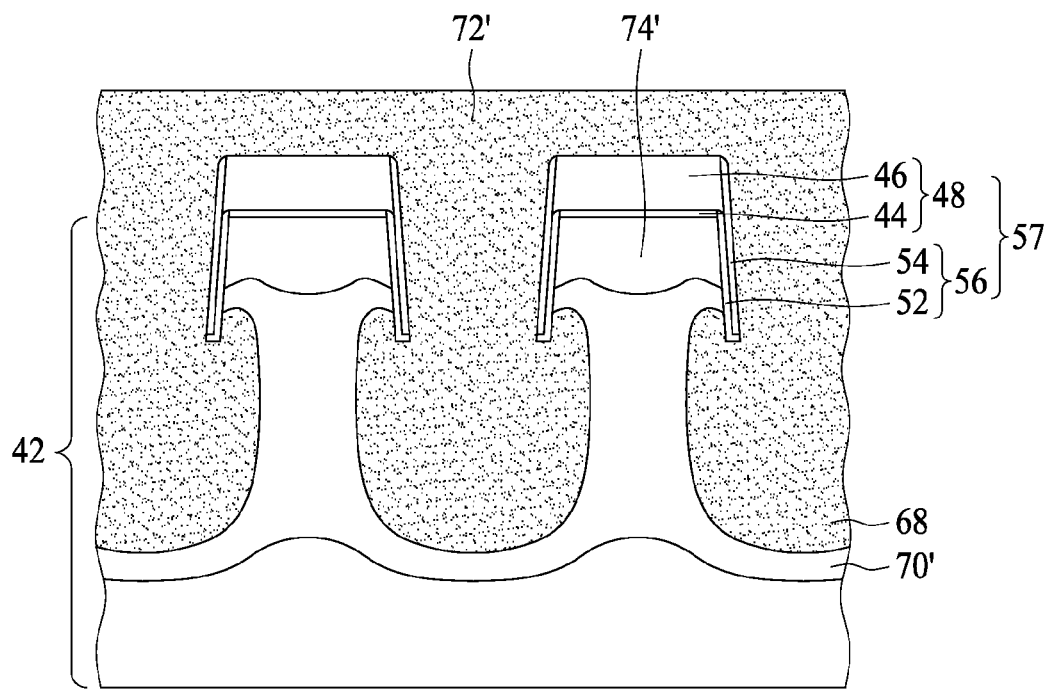

Referring to FIG. 19, a thermal treating process is then performed in an oxygen-containing atmosphere or steam-containing atmosphere for an increased duration to completely convert the stem portion 58 of the pillars 60 into an insulation layer 70' by the thermal oxidation process. Consequently, a device region 74' is formed in the head portion 50 of the pillars 60, i.e., in an upper portion of the semiconductor substrate 42, and the dielectric layer 68 and the insulation layer 70' isolates the device region 74' from the bottom portion of the semiconductor substrate 42. In particular, the dielectric layer 68 and the insulation layer 70' not only serves as the insulator of the conventional silicon-on-insulator (SOI) structure, but also serves as the conventional shallow trench isolation (STI) structure surrounding the active area.

In particular, the structure shown in FIG. 19 can be considered as the device region 74' and an insulating region 72' adjacent to the device region 74', and the dielectric layer 68 in the insulating region 72' can be considered as a bottle-shaped shallow trench isolation structure surrounding a device region 74' in the mushroom-shaped pillar 60 of the semiconductor substrate 42. Furthermore, the dielectric layers 52 and 54 are sandwiched between the device region 74' and the insulation region 72'. The stem portion 58 of the mushroom-shaped pillar 60 is made of silicon oxide (insulating material), and the head portion 50 of the mushroom-shaped pillar 60 is surrounded by the dielectric layers 52 and 54.

In particular, the structure shown in FIG. 19 can be considered as the device region 74' and an insulating region 72' adjacent to the device region 74', and the dielectric layer 68 in the insulating region 72' can be considered as a bottle-shaped shallow trench isolation structure surrounding a device region 74' in the mushroom-shaped pillar 60 of the semiconductor substrate 42. Furthermore, the dielectric layers 52 and 54 are sandwiched between the device region 74' and the insulation region 72'. The stem portion 58 of the mushroom-shaped pillar 60 is made of silicon oxide (insulating material), and the head portion 50 of the mushroom-shaped pillar 60 is surrounded by the dielectric layers 52 and 54.

Figure 20:
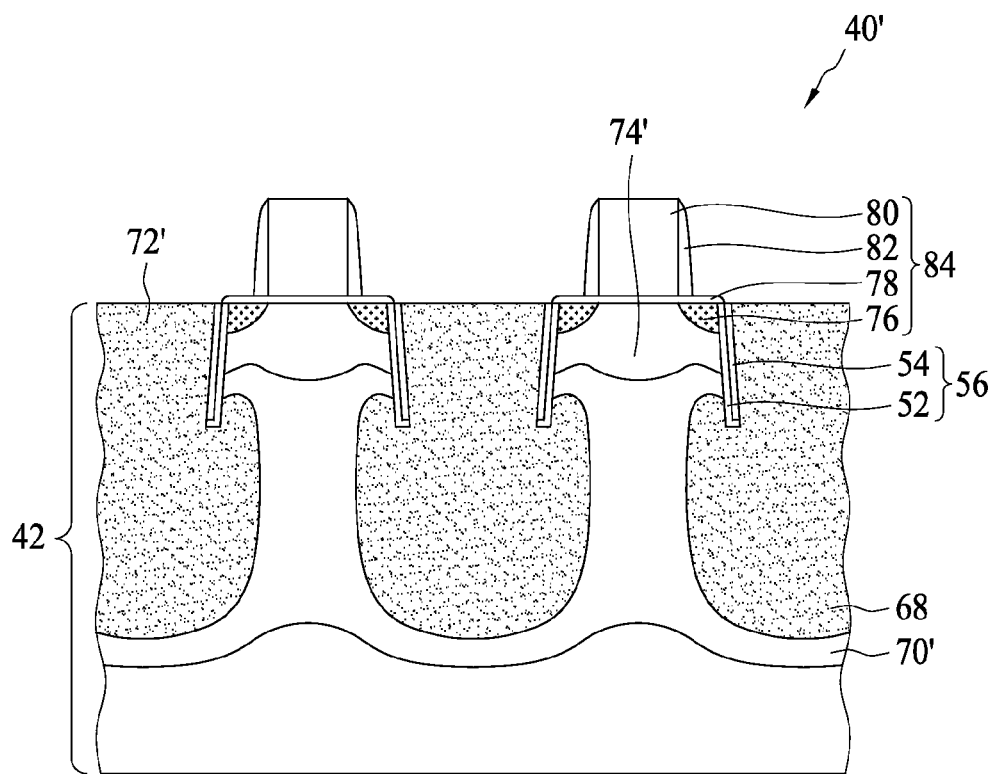

Referring to FIG. 20, the top masks 48 and a portion of the dielectric layer 68 above the semiconductor substrate 42 are removed by a planarization process such as the chemical mechanical polishing process. Subsequently, a transistor structure 84 is formed in the device region 74' and an insulation layer 82 is formed to cover the transistor structure 84 and the semiconductor substrate 42 so as to complete the integrated circuit structure 40'. The transistor structure 84 may include two diffusion regions 76 in the head portion (protrusion) 50 of the pillar 60, a gate oxide layer 78 on the semiconductor substrate 42, a gate stack 80 on the gate oxide layer 78 and two nitride spacers 82 on the sidewalls of the gate stack 80.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure, comprising:
   a semiconductor substrate;
   a device region positioned in the semiconductor substrate;
   a mushroom-shaped pillar having an undercut positioned in the device region;
   an insulating region adjacent to the device region;
   an isolation structure positioned in the insulating region and including a bottle portion and a neck portion filled with a dielectric material; and
   a dielectric layer sandwiched between the device region and the neck portion of the isolation structure.

2. The integrated circuit structure of claim 1, wherein the device region is positioned in an upper position of the mushroom-shaped pillar.

3. The integrated circuit structure of claim 1, wherein the mushroom-shaped pillar includes a stem portion and a head portion on the stem portion.

4. The integrated circuit structure of claim 3, wherein the width of the head portion is larger than that of the stem portion.

5. The integrated circuit structure of claim 3, wherein the width of the stem portion changes gradually.

6. The integrated circuit structure of claim 1, wherein the dielectric material is a spin on dielectric.

7. The integrated circuit structure of claim 1, further comprising a silicon oxide layer sandwiched between the isolation structure and the mushroom-shaped pillar.

8. The integrated circuit structure of claim 7, wherein the silicon oxide layer has a higher resistance to an acidic etchant than does the dielectric material.

9. The integrated circuit structure of claim 1, further comprising a transistor structure formed in the device region, and having a gate oxide layer, a gate stack, and two diffusion regions.

10. An integrated circuit structure, comprising:
a semiconductor substrate;
a device region positioned in the semiconductor substrate;
a mushroom-shaped pillar having an undercut positioned in the device region, and including a stem portion and a head portion on the stem portion;
an insulating region adjacent to the device region;
an isolation structure positioned in the insulating region and including a bottle portion and a neck portion on the bottle portion;
a dielectric layer sandwiched between the device region and the neck portion of the isolation structure; and
an insulation layer sandwiched between the bottle portion of the isolation structure and the mushroom-shaped pillar.

11. The integrated circuit structure of claim 10, wherein the insulation layer is made of an insulating material having a stronger acid-resistance than the isolation structure.

12. The integrated circuit structure of claim 10, wherein the width of the head portion is larger than that of the stem portion.

13. The integrated circuit structure of claim 10, further comprising a transistor structure formed in the device region, and having a gate oxide layer, a gate stack, and two diffusion regions.

14. An integrated circuit structure, comprising:
a semiconductor substrate;
a device region positioned in the semiconductor substrate;
a mushroom-shaped pillar positioned in the device region, and including a stem portion and a head portion on the stem portion;
an insulating region adjacent to the device region;
an isolation structure positioned in the insulating region and including a bottle portion and a neck portion on the bottle portion;
a dielectric layer sandwiched between the device region and the insulation region; and
wherein the stem portion of the mushroom-shaped pillar is made of an insulating material, and the head portion of the mushroom-shaped pillar is surrounded by the dielectric layer.

15. The integrated circuit structure of claim 14, wherein the insulating material having a stronger acid-resistance than the isolation structure.

16. The integrated circuit structure of claim 14, wherein the width of the head portion is larger than that of the stem portion.

17. The integrated circuit structure of claim 14, further comprising a transistor structure formed in the device region, and having a gate oxide layer, a gate stack, and two diffusion regions.

18. The integrated circuit structure of claim 17, wherein the diffusion regions are formed in the head portion of the mushroom-shaped pillar.

* * * * *